US006858936B2

United States Patent
Minamihaba et al.

(10) Patent No.: US 6,858,936 B2
(45) Date of Patent: Feb. 22, 2005

(54) SEMICONDUCTOR DEVICE HAVING AN IMPROVED CONSTRUCTION IN THE INTERLAYER INSULATING FILM

(75) Inventors: Gaku Minamihaba, Kawasaki (JP); Dai Fukushima, Sagamihara (JP); Yoshikuni Tateyama, Hiratsuka (JP); Hiroyuki Yano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/609,649

(22) Filed: Jul. 1, 2003

(65) Prior Publication Data

US 2004/0070077 A1 Apr. 15, 2004

(30) Foreign Application Priority Data

Jul. 1, 2002 (JP) .......................... 2002-191632

(51) Int. Cl.[7] .................... H01L 23/48; H01L 23/52; H01L 29/40
(52) U.S. Cl. ........................ 257/758; 257/774
(58) Field of Search ................ 257/635, 758, 257/759, 760, 763, 774, 775

(56) References Cited

U.S. PATENT DOCUMENTS 6,498,384 B1 * 12/2002 Marathe .................. 257/520

FOREIGN PATENT DOCUMENTS

| JP | 2-130828 | 5/1990 |
| JP | 6-112204 | 4/1994 |
| JP | 2000-294634 | 10/2000 |
| JP | 2001-316222 | 11/2001 |
| JP | 2001-358218 | 12/2001 |

* cited by examiner

*Primary Examiner*—Hoai Pham
(74) *Attorney, Agent, or Firm*—Finnegan, Henderson, Farabow, Garrett & Dunner, L.L.P.

(57) ABSTRACT

A semiconductor device comprises a semiconductor substrate, an interlayer insulating film including a first insulating film formed above the substrate and having a relative dielectric constant smaller than 2.5 and a second insulating film formed to cover the first insulating film and having a relative dielectric constant larger than that of the first insulating film, and a buried wiring formed within the interlayer insulating film. A bottom portion of the second insulating film is buried in the first insulating film at a number of points.

10 Claims, 3 Drawing Sheets

SEMICONDUCTOR DEVICE HAVING AN IMPROVED CONSTRUCTION IN THE INTERLAYER INSULATING FILM

CROSS-REFERENCE TO RELATED APPLICATIONS

This application is based upon and claims the benefit of priority from the prior Japanese Patent Application No. 2002-191632, filed Jul. 1, 2002, the entire contents of which are incorporated herein by reference.

BACKGROUND OF THE INVENTION

1. Field of the Invention

The present invention relates to a semiconductor device and a method of manufacturing the same, particularly, to a semiconductor device having an improved construction in the interlayer insulating film in which a buried wiring is formed and a method of manufacturing the particular semiconductor device.

2. Description of the Related Art

In recent years, the delay in the signal transmission of the wiring included in a ULSI has come to form a problem in accordance with progress in the density of the ULSI. As a measure for overcoming the problem, efforts are being made in an attempt to decrease the dielectric constant of the interlayer insulating film and to lower the resistance of the wiring material. It is possible to decrease the dielectric constant of the interlayer insulating layer by using an insulating material having a low dielectric constant, e.g., having a relative dielectric constant lower than 2.5. On the other hand, the use of, for example, copper wiring has attracted attention as a measure for lowering the resistance of the wiring material.

The use of copper wiring is certainly advantageous for lowering the resistance of the wiring material. However, it is very difficult to apply a fine processing to the copper wiring. Such being the situation, a damascene method is employed in general for forming copper wiring. In the damascene method, a trench equal in width to the wiring is formed first in an interlayer insulating film formed on a semiconductor substrate, followed by burying a wiring material such as copper in the trench. Then, the excess wiring material is removed from the surface of the interlayer insulating film by a CMP (Chemical Mechanical Polishing) method so as to form a buried copper wiring.

Where an insulating material having a low mechanical strength and a low dielectric constant is used for forming the interlayer insulating film, it is required for the interlayer insulating film to exhibit a high resistance to the dry etching treatment (i.e., a high resistance to the plasma etching) and a high resistance to a CMP treatment. Under the circumstances, it is disclosed in, for example, Jpn. Pat. Appln. KOKAI Publication No. 2001-358218 that an insulating material layer having a larger mechanical strength is laminated as a cap layer on an insulating material layer having a low dielectric constant. To be more specific, a wiring trench is formed in an interlayer insulating film of a laminate structure consisting of an insulating film having a low dielectric constant and a cap insulating layer. Then, a wiring material is buried on the interlayer insulating film including the wiring trench, followed by applying a CMP treatment so as to form a buried wiring.

However, the lamination between the insulating film having a low dielectric constant and the cap insulating layer is accompanied by stress, with the result that peeling tends to take place at the interface between the insulating film having a low dielectric constant and the cap insulating film during the CMP treatment involving the application of a mechanical force. It follows that the reliability and the yield of the semiconductor device are reduced.

As pointed out above, in the conventional semiconductor device, it was possible for the interlayer insulating film of a laminate structure formed of an insulating film having a low dielectric constant to be peeled in forming a wiring by burying a wiring material in the interlayer insulating film. Therefore, in the semiconductor device in which the dielectric constant of the interlayer insulating film is lowered for improving the performance of the semiconductor device, it is of great importance to prevent the interlayer insulating film of a laminate structure from being peeled so as to improve the reliability and the yield of the semiconductor device.

BRIEF SUMMARY OF THE INVENTION

According to a first aspect of the present invention, there is provided a semiconductor device, comprising:

an interlayer insulating film including a first insulating film formed above a semiconductor substrate and having a relative dielectric constant smaller than 2.5 and a second insulating film formed to cover the first insulating film and having a relative dielectric constant larger than that of the first insulating film; and a buried wiring formed in the interlayer insulating film, wherein a bottom portion of the second insulating film is buried in a number of points in the first insulating film.

Further, according to a second aspect of the present invention, there is provided a method of manufacturing a semiconductor device, comprising:

forming a first insulating film having a relative dielectric constant smaller than 2.5 above a semiconductor substrate;

forming a number of concavities in the first insulating film;

forming a second insulating film having a relative dielectric constant larger than that of the first insulating film on the first insulating film so as to form a laminate structure film such that a bottom portion of the second insulating film is buried in a number of concavities formed in the first insulating film;

forming a trench for burying a wiring in the laminate structure film;

forming a conductive material layer on the laminate structure film including the trench; and applying a CMP (Chemical Mechanical Polishing) treatment to the conductive material layer such that the conductive material is left unremoved within the trench to form a buried wiring.

DETAILED DESCRIPTION OF THE INVENTION

Some embodiments of the present invention will now be described in detail with reference to the accompanying drawings.

First Embodiment

Figure 1:
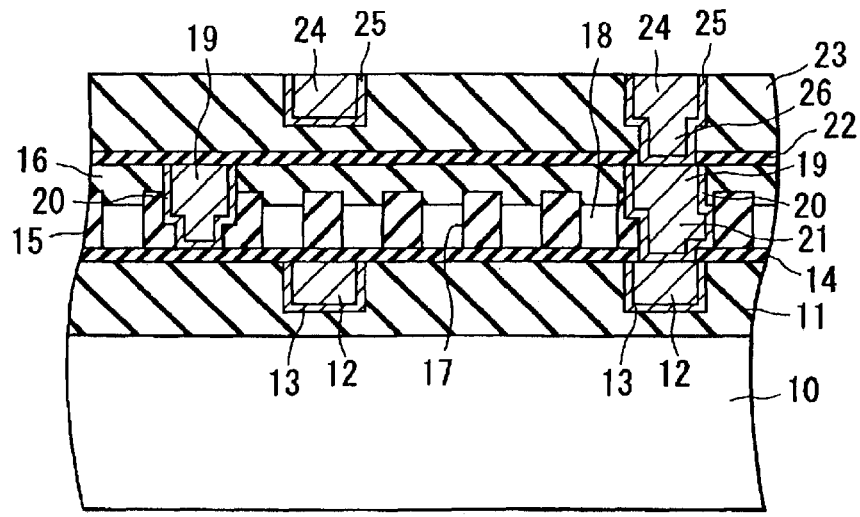
FIG. 1 is a cross-sectional view showing the construction of a semiconductor device according to a first embodiment of the present invention.

FIG. 1 is a cross-sectional view showing the construction of a semiconductor device having a multi-layered wiring structure according to a first embodiment of the present invention.

As shown in the drawing, a first interlayer insulating film 11 having a thickness of, for example, 300 nm, is formed on a semiconductor substrate 10 having active elements (not shown) formed therein. A first layer wiring 12 having a thickness of, for example, 200 nm, is buried in the first interlayer insulating film 11 such that the side surface and the bottom surface of the first layer wiring 12 are covered with a barrier metal layer 13 having a thickness of, for example, 20 nm. Incidentally, it is possible for some of the wirings 12 to be electrically connected to, for example, the active element formed in the semiconductor substrate 10 through a contact plug (not shown).

The first interlayer insulating film 11 is formed of any of the materials selected from the group consisting of an insulating material having a low dielectric constant, i.e., an insulating material having a relative dielectric constant smaller than 2.5, and an insulating material having a relative dielectric not smaller than 2.5. Also, it is possible for the first interlayer insulating film 11 to be of a laminate structure consisting of a low dielectric constant insulating material layer having a relative dielectric constant smaller than 2.5 and a cap layer formed of a insulating material having a larger relative dielectric constant. The low dielectric constant insulating material having a relative dielectric constant smaller than 2.5 and the insulating material having a larger relative dielectric constant referred to above will be described herein later.

Each of the first layer wiring 12 and the contact plug referred above is formed of, for example, copper, aluminum, tungsten or an alloy containing any of these metals.

The barrier metal layer 13 is formed of, for example, tantalum, titanium, niobium, tungsten, an alloy thereof, or a compound thereof. It is acceptable for the barrier metal layer 13 to be of a single layer structure or of a laminate structure.

Also, a diffusion preventing film 14 having a thickness of, for example, 50 nm is formed on the first interlayer insulating film 11 having the first layer wiring 12 buried therein so as to prevent the diffusion of the metal constituting the first layer wiring 12. The diffusion preventing film 14 is formed of, for example, SiN, SiC or SiCN. A low dielectric constant insulating film 15, which is a first insulating film having a thickness of, for example, 200 nm and made of a low dielectric constant insulating material having a relative dielectric constant smaller than 2.5, is formed on the diffusion preventing film 14. A cap insulating film 16, which is second insulating film having a thickness of, for example, 100 nm and made of an insulating material having a larger relative dielectric constant, is laminated on the low dielectric constant insulating film 15. The laminate structure consisting of the low dielectric constant insulating film 15 and the cap insulating film 16 constitutes a second interlayer insulating film. In the second interlayer insulating film, the bottom portion of the cap insulating film 16 is buried in a large number of points in the low dielectric constant insulating film 15. To be more specific, a large number of concavities 17 are formed deep in the low dielectric constant insulating film 15 in a manner to extend to reach the diffusion preventing film 14, and the bottom portion of the cap insulating film 16 is buried to reach an intermediate position in the depth direction of the large number of concavities 17. Incidentally, a void space 18 is formed in a lower portion of the concavity 17 because the cap insulating film 16 is buried in an upper portion of the concavity 17. A second layer wiring 19 having a thickness of, for example, 200 nm is buried in the second interlayer insulating film of the laminate structure noted above such that the side surface and the bottom surface of the second layer wiring 19 are covered with a barrier metal layer 20 having a thickness of, for example, 20 nm. Incidentally, the bottom portions of some of the second layer wirings 19 are electrically connected to the first layer wirings 12. For example, the bottom portion of the second layer wiring 19 on the right side in the drawing is electrically connected to the first layer wiring 12 through a via plug 21 formed through the diffusion preventing film 14.

The low dielectric constant insulating film 15 formed of a low dielectric constant insulating material having a relative dielectric constant smaller than 2.5 is, for example, a film of a material having a siloxane skeleton such as polysiloxane, hydrogen silsesqueoxane, polymethyl siloxane, or methyl silsesqueoxane; a film of a material having as a main component an organic resin such as polyarylene ether, polybenzoxazole or polybenzo cyclobutene; or a porous film such as a porous silica film.

On the other hand, the cap insulating film 16 is formed of an insulating material having a relative dielectric constant not smaller than 2.5 such as SiO, SiOP, SiOF, SiON, SiC, SiCH, SiCN, SiOC, or SiOCH.

It is desirable for the cap insulating film 16 to be formed in a thickness not larger than 200 nm, preferably in a thickness of 20 to 100 nm. Where the cap insulating film 16 is formed in the thickness noted above, it is possible to lower the dielectric constant of the second interlayer insulating film including the cap insulating film 16. It should be noted, however, that, if the cap insulating film 16 makes up for the brittleness of the low dielectric constant insulating film 15 so as to improve sufficiently the resistance to the dry etching treatment (resistance to plasma) and the resistance to the CMP treatment of the second interlayer insulating film, it is possible to use an insulating material having a relative dielectric constant smaller than 2.5 for forming the cap insulating film 16. In this case, it is possible for the thickness of the cap insulating film 16 to be not smaller than 200 nm.

Where the bottom portion of the cap insulating film 16 is buried in the low dielectric constant insulating film 15, it is possible for the region of the burying portion, e.g., the region of forming the concavities 17, to be a part or the entire region of the low dielectric constant insulating film 15.

It is desirable for the burying depth in the bottom portion of the cap insulating film 16 into the low dielectric constant insulating film 15 to be not smaller than 10 nm. Naturally, it is desirable for the depth of the concavity 17 in which the bottom portion of the cap insulating film 16 is buried to be not smaller than 10 nm. If the burying depth in the bottom portion of the cap insulating film 16 is smaller than 10 nm, it is difficult for the cap insulating film 16 to be bonded to the low dielectric constant insulating film 15 with a sufficiently high bonding strength.

It is desirable for the concavity 17 corresponding to the burying portion in the bottom portion of the cap insulating film 16 to have, for example, a rectangular or linear opening. Also, it is desirable for the opening of the concavity 17 to have a short side of, for example, 0.01 to 0.4 $\mu$m. If the short side of the opening of the concavity 17 is smaller than 0.01 $\mu$m, it is difficult to form the concavities as desired. Also, it is difficult to bury the bottom portion of the cap insulating film 16 in the concavity 17. On the other hand, if the short side of the opening of the concavity 17 exceeds 0.4 $\mu$m, the width in the burying portion of the cap insulating film 16 is increased, with the result that the shape of the burying portion is transcribed onto the upper surface of the cap insulating film 16 so as to bring about a stepped portion on the upper surface of the cap insulating film 16. It follows that the flatness of the cap insulating film 16 tends to be impaired. It is more desirable for the short side in the opening of the concavity 17 to be 0.05 to 0.1 $\mu$m.

It is possible for the corner portions of the concavity 17 to have roundish shaped because of, for example, the photo proximity effect produced in the pattern forming step utilizing the photolithography technology.

It is desirable for the concavities 17 to be formed in the low dielectric constant insulating film 15 at a pitch of 0.02 to 100 $\mu$m and to be arranged regularly so as to make the pattern design simple and convenient. If the concavities 17 are formed at a pitch smaller than 0.02 $\mu$m, the density of the concavities 17 formed in the low dielectric constant insulating film 15 tends to be rendered high, resulting in failure to ensure the required mechanical strength of the low dielectric constant insulating film 15. On the other hand, if the concavities 17 are arranged at a pitch exceeding 100 $\mu$m, it is difficult to increase sufficiently the bonding strength between the low dielectric constant insulating film 15 and the cap insulating film 16 so as to make it difficult to suppress the peeling of the cap insulating film 16 at the interface between the low dielectric constant insulating film 15 and the cap insulating film 16. It is more desirable for the concavities 17 to be arranged at a pitch falling within the range of 0.1 to 10 $\mu$m.

It is possible to form the second layer wiring 19, the via plug 21 and the barrier metal layer 20 in the second interlayer insulating film by using the materials equal to those used for forming the first layer wiring 12, etc. in the first interlayer insulating film.

Further, a diffusion preventing film 22 having a thickness of, for example, 50 nm is formed on the cap insulating film 16 included in the second interlayer insulating film having the second layer wiring 19 buried therein so as to prevent the diffusion of the metal constituting the wiring 19. The diffusion preventing film 22 is formed of, for example, SiN, SiC or SiCN. A third interlayer insulating film 23 having a thickness of, for example, 300 nm is formed on the diffusion preventing film 22. A third layer wiring 24 having a thickness of, for example, 200 nm are buried in the third interlayer insulating film 23 such that the side surface and the bottom surface of the third layer wiring 24 are covered with a barrier metal layer 25 having a thickness of, for example, 20 nm. Incidentally, the bottom portions of some of the third layer wirings 24 are electrically connected to the second layer wiring 19. For example, the bottom portion of the third layer wiring 24 on the right side in the drawing is electrically connected to the second layer wiring 19 through a via plug 26 extending through the diffusion preventing film 22.

It is possible to form the third interlayer insulating film 23 by using any of the insulating materials selected from the group consisting of a low dielectric constant insulating film material having a relative dielectric constant smaller than 2.5 and an insulating material having a relative dielectric constant not smaller than 2.5. Also, it is possible for the third interlayer insulating film 23 to be of a laminate structure consisting of a low dielectric constant insulating material layer having a relative dielectric constant smaller than 2.5 and an insulating material layer having a larger relative dielectric constant, which is formed on the low dielectric constant material layer as a cap insulating layer.

It is possible to form the third layer wiring 24, the via plug 26 and the barrier metal layer 25 in the third interlayer insulating film 23 by using materials equal to those used for forming the first layer wiring 12, etc. in the first interlayer insulating film.

As described above, in the first embodiment of the present invention, the cap insulating film 16 is laminated on the low dielectric constant insulating film 15 such that the bottom portion of the cap insulating film 16 is buried in a large number of points in the low dielectric constant insulating film 15 so as to form the second interlayer insulating film. As a result, it is possible to improve the bonding strength between the low dielectric constant insulating film 15 and the cap insulating film 16 because of the anchoring effect produced in the buried portion of the cap insulating film 16. Particularly, the anchoring effect can be further enhanced while maintaining the required mechanical strength of the low dielectric constant insulating film 15 by setting the buried depth of the bottom portion of the cap insulating film 16 in the low dielectric constant insulating film 15 at 10 nm or more, by setting the short side of the opening of each of a large number of concavities 17 formed in the low dielectric constant insulating film 15 corresponding to the burying portions of the bottom portion of the cap insulating film 16 to fall within a range of between 0.01 $\mu$m and 0.4 $\mu$m, and by setting the pitch of the concavities 17 to fall within a range of between 0.02 $\mu$m and 100 $\mu$m.

As a result, the bonding strength between the low dielectric constant insulating film 15 and the cap insulating film 16 is increased and, thus, the peeling at the interface between the low dielectric constant insulating film 15 and the cap insulating film 16 can be prevented during, for example, a CMP treatment employed for forming the second layer wiring 19 in the second interlayer insulating film of a laminate structure consisting of the low dielectric constant insulating film 15 and the cap insulating film 16. It follows that the performance of the resultant semiconductor device can be improved because of the decrease in the dielectric constant of the second interlayer insulating film of the laminate structure consisting of the low dielectric constant film 15 and the cap insulating film 16. In addition, the peeling between the low dielectric constant insulating film 15 and the cap insulating film 16 can be prevented so as to make it possible to obtain a semiconductor device having an improved reliability.

Incidentally, it is also possible to suppress the peeling between the low dielectric constant insulating film and the cap insulating film by forming a dummy wiring in the field region of the second interlayer insulating film, i.e., the region where the second layer wiring is not present.

However, the formation of the dummy wiring tends to increase the coupling capacitance between the second layer wirings and the coupling capacitance between the first layer wiring and the third layer wiring with the dummy wiring interposed therebetween so as to delay the signal transmission through the wiring of the multi-layered wiring structure.

According to the first embodiment of the present invention, it is possible to suppress the generation of the peeling at the interface between the low dielectric constant insulating film and the cap insulating film while scarcely increasing the coupling capacitance between the adjacent wirings and between the adjacent wiring layers so as to make it possible to obtain a semiconductor device exhibiting a high performance and having a high reliability.

It should also be noted that it is possible to further decrease the dielectric constant of the second interlayer insulating film having a laminate structure consisting of the low dielectric constant insulating film 15 and the cap insulating film 16, if the bottom portion of the cap insulating film 16 is buried in the large number of concavities 17 to reach an intermediate position in the depth direction of the concavity 17 so as to allow the free space 18, i.e., an air layer, to be left in the lower portion of each of the large number of concavities 17 as shown in FIG. 1.

Figure 2:
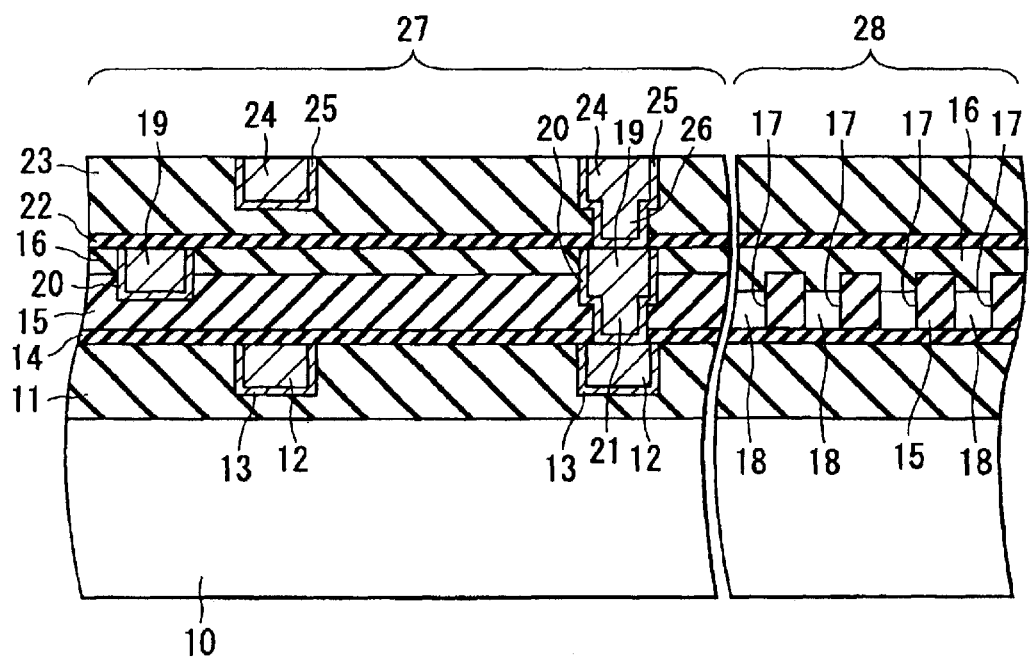
FIG. 2 is a cross-sectional view showing the construction of a semiconductor device according to the first embodiment of the present invention, in which a buried portion of a cap insulating film is formed in the field region.

When the bottom portion of the cap insulating film 16 is buried in the low dielectric constant insulating film 15 in a large number of points, it is possible for the region of the burying portion, e.g., the region of forming the concavities 17, to be a field region of the second interlayer insulating film in which the wiring is not present over a wide range. To be more specific, in preparing the second interlayer insulating film by stacking the cap insulating film 16 on the low dielectric constant insulating film 15, it is possible to stack the cap insulating film 16 on the low dielectric constant insulating film 15 in a manner to eliminate the burying portion in the wiring-forming region 27 and to bury the bottom portion of the cap insulating film 16 in the low dielectric constant insulating film 15 in a large number of points in the field region 28, as shown in FIG. 2. According to the semiconductor device of the particular construction, it is possible to increase the bonding strength between the low dielectric constant insulating film 15 and the cap insulating film 16 because the bottom portion of the cap insulating film 16 is buried in the low dielectric constant insulating film 15 in a large number of points in the field region 28. Also, since the cap insulating film 16 is stacked on the low dielectric constant insulating film 15 in a manner to eliminate the burying portion in the wiring-forming region 27, it is possible to avoid the increase in the coupling capacitance between the adjacent wirings 19 formed in the second interlayer insulating film and the coupling capacitance between the wiring layers formed in the adjacent interlayer insulating films stacked one upon the other, the increase in the coupling capacitance being derived from the construction that the bottom portion of the cap insulating film 16 is buried in the low dielectric constant insulating film 15.

Second Embodiment

A second embodiment of the present invention is directed to the manufacturing method of the semiconductor device according to the first embodiment of the present invention described above. The second embodiment will now be described with reference to FIGS. 3A to 3E.

First Step

Figure 3A:
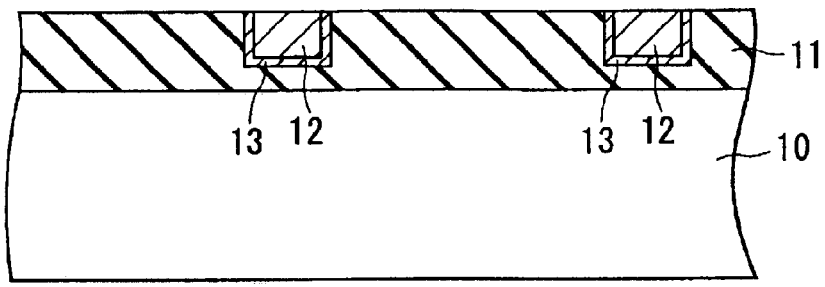
FIGS. 3A to 3E are cross-sectional views collectively showing a process of manufacturing a semiconductor device according to a second embodiment of the present invention.

First of all, a first interlayer insulating film 11 is formed on a semiconductor substrate 10 having, for example, an active element (not shown) formed therein, as shown in FIG. 3A. Then, a resist pattern or the like is formed on the first interlayer insulating film 11, followed by selectively removing the first interlayer insulating film 11 by an RIE (Reactive Ion Etching) method with the resist pattern used as a mask so as to form contact holes extending to reach the surface of the semiconductor substrate 10. After formation of the contact holes, wiring trenches are formed by the RIE method using another mask pattern in that portion of the first interlayer insulating film 11 in which a prescribed contact hole is present and in the other portion of the first interlayer insulating film 11, followed by forming a barrier metal layer 13 by, for example, a sputtering method and subsequently forming a wiring material on the first interlayer insulating film 11 including the wiring trench and the contact hole.

In the next step, the excess wiring material and the barrier metal layer 13 positioned on the first interlayer insulating film 11 are removed by a CMP method so as to form a first layer wiring 12 in the first interlayer insulating film 11 such that the side surface and the bottom surface of the first layer wiring 12 were covered with the barrier metal layer 13. At the same time, a contact plug (not shown) is formed in the first interlayer insulating film 11 such that the side surface and the bottom surface of the contact plug is covered with the barrier metal layer 13. In the CMP treatment, the excess wiring material positioned on the first interlayer insulating film is removed by a first polishing, and the excess barrier metal layer 13 positioned on the first interlayer insulating film 11 is removed by a second polishing.

It is possible to form the first interlayer insulating film 11 by using a material similar to that described previously in conjunction with the first embodiment of the present invention.

The barrier metal layer 13 is formed of, for example, tantalum, titanium, niobium, tungsten, an alloy containing these metals, or a compound of these metals. It is acceptable for the barrier metal layer 13 to be of a single layer structure or of a laminate structure.

It is possible to use, for example, copper, aluminum, tungsten, or an alloy containing these metals as the wiring material. The wiring material can be buried in the wiring trench by the combination of, for example, a sputtering method and a plating method.

Second Step

Figure 3B:
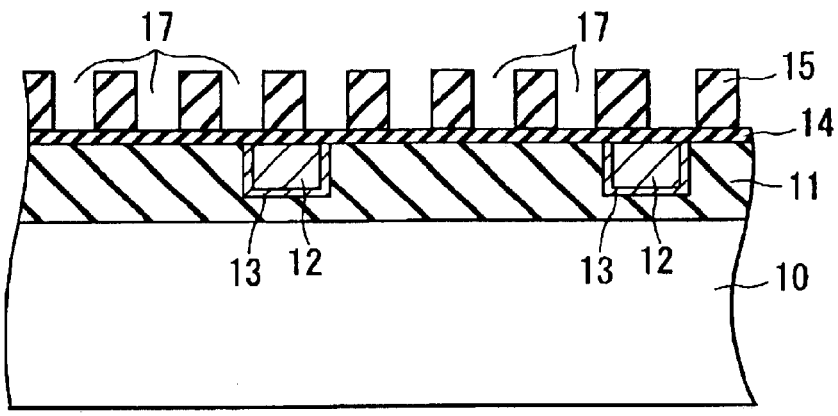

As shown in FIG. 3B, a diffusion preventing film 14 is formed on the first interlayer insulating film 11 having the first layer wiring 12 buried therein, followed by forming a low dielectric constant film 15 on the diffusion preventing film 14. Then, an etching pattern such as a resist pattern is formed on the low dielectric constant insulating film 15, followed by forming a large number of concavities 17 in the low dielectric constant insulating film 15 by an RIE method using the resist pattern as a mask. In this case, the etching is stopped when the diffusion preventing film 14 is exposed to the outside at the bottom of the concavity 17.

It is possible for the diffusion preventing film 14 and the low dielectric constant insulating film 15 to be formed of the materials similar to those described previously in conjunction with the first embodiment of the present invention.

The diffusion preventing film 14 can be formed by, for example, a CVD method. On the other hand, the low dielectric constant insulating film 15 can be formed by, for example, a CVD method or a coating method.

The type of the concavity 17 is equal to that described previously in conjunction with the first embodiment of the present invention.

It is desirable for the concavity 17 to be formed in the low dielectric constant insulating film 15 such that the total area of the openings of the concavities 17 falls within a range of between 0.000001% and 50% of the surface area of the low dielectric constant insulating film 15. If the total area of the openings of the concavities 17 is smaller than 0.000001% of the surface area of the low dielectric constant insulating film 15, it is difficult to improve the bonding strength derived from the anchoring effect between the cap insulating film 16 and the dielectric constant insulating film 15 even if the bottom portion of the cap insulating film 16 is buried in the concavities of the low dielectric constant insulating film 15. On the other hand, if the total area of the openings of the concavities 17 exceeds 50% of the surface area of the low dielectric constant insulating film 15, it is difficult to ensure a sufficiently high mechanical strength of the low dielectric constant insulating film 15. It is more desirable for the total area of the openings of the concavities 17 to fall within a range of between 0.1% and 30% of the surface area of the low dielectric constant insulating film 15.

Third Step

Figure 3C:
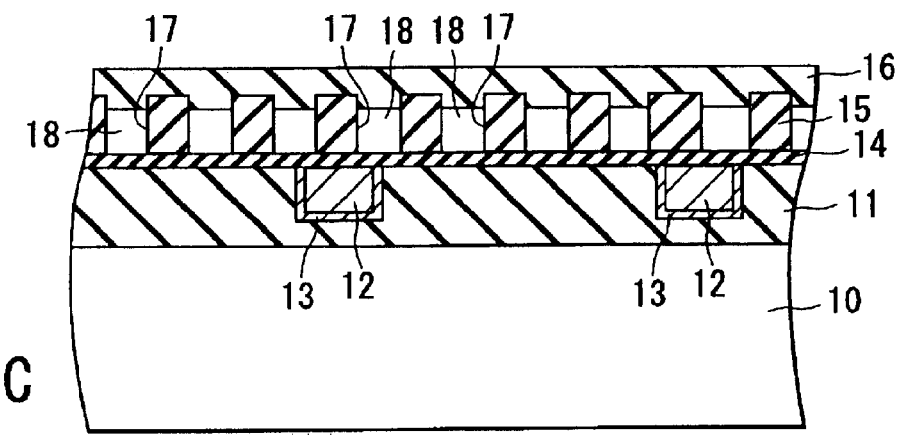

A cap insulating film 16 is formed on the low dielectric constant insulating film 15 having a large number of concavities 17 formed therein, as shown in FIG. 3C. In this case, the bottom portion of the cap insulating film 16 is not buried completely in the concavity 17 such that a free space 18 is left in a lower portion of the concavity 17 on the side of the diffusion preventing film 14. It should be noted, however, that it is desirable to bury the bottom portion of the cap insulating film 16 in a depth not smaller than 10 nm within each concavity 17 such that the buried portion of the cap insulating film 16 is continuously brought into contact with the inner surface of the concavity 17.

It is possible for the cap insulating film 16 to be formed of a material similar to that described previously in conjunction with the first embodiment of the present invention. The cap insulating film 16 can be formed by, for example, a CVD method or a coating method.

Fourth Step

Figure 3D:
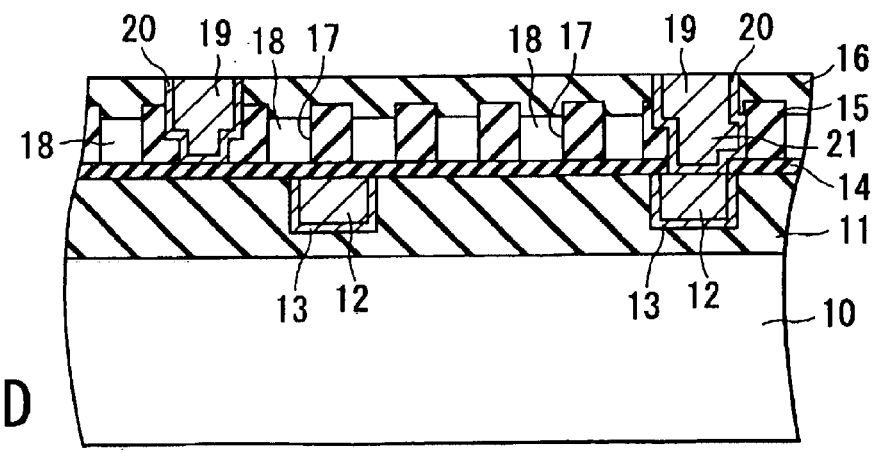

An etching mask such as a resist pattern is formed on the second interlayer insulating film of a laminate structure consisting of the low dielectric constant insulating film 15 and the cap insulating film 16, followed by selectively removing the second interlayer insulating film by an RIE method with the resist pattern used as a mask so as to form via holes extending to reach the diffusion preventing film 14, as shown in FIG. 3D. Then, wiring trenches are formed by the RIE method using another mask pattern in that portion of the second interlayer insulating film in which a prescribed via hole is positioned and in the other portion of the second interlayer insulating film and subsequently removing the exposed portion of the diffusion preventing film 14 by, for example, an RIE method. Further, a barrier metal layer 20 is formed by, for example, a sputtering method, followed by further forming a wiring material layer on the second interlayer insulating film including the wiring trench and the via hole.

In the next step, the excess wiring material and the barrier metal layer 20 positioned on the second interlayer insulating film except the inner region of the wiring trench and the inner region of the via hole are removed by a CMP method so as to form a second layer wiring 19 in the second interlayer insulating film such that the side surface and the bottom surface of the second layer wiring 19 are covered with the barrier metal layer 20. At the same time, a second layer wiring 19 is formed in the second interlayer insulating film such that the side surface and the bottom surface of the second layer wiring 19 were covered with the barrier metal layer 20 and is electrically connected to the first layer wiring 12 through the via plug 21. In the CMP treatment, the excess wiring material positioned on the second interlayer insulating film is removed by a first polishing, and excess barrier metal layer 20 positioned on the second interlayer insulating film is removed by a second polishing.

The barrier metal layer 20 is formed as in the formation of the barrier metal layer 13 in respect of the material and the forming method.

It is possible to use, for example, copper, aluminum, tungsten or an alloy containing these metals as the material of the wiring. Also, the wiring material can be buried in the wiring trench, etc. by the combination of, for example, a sputtering method and a plating method.

Fifth Step

Figure 3E:
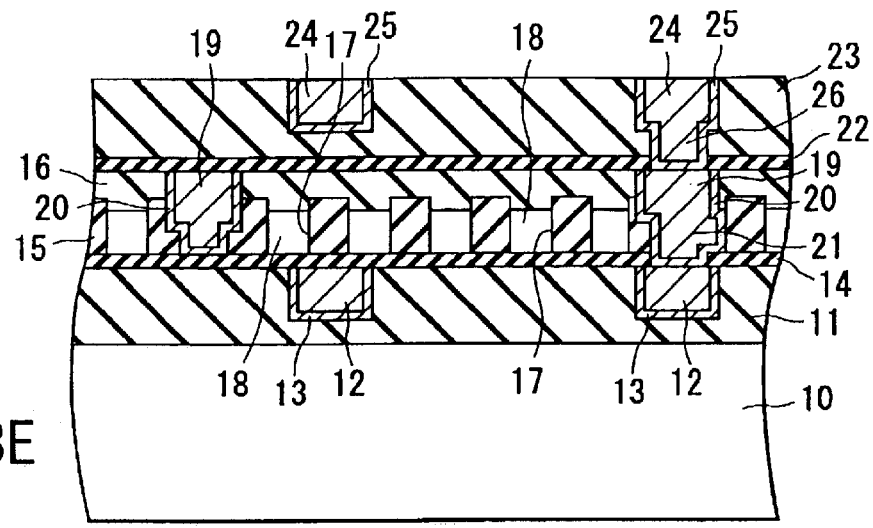

In the next step, a diffusion preventing film 22 is formed on the cap insulating film 16 included in the second interlayer insulating film, followed by forming a third interlayer insulating film 23, as shown in FIG. 3E. Then, an etching pattern such as a resist pattern is formed on the third interlayer insulating film 23, followed by selectively removing the third interlayer insulating film 23 by the RIE method with the resist pattern used as a mask so as to form via holes extending to reach the diffusion preventing film 22. Further, wiring trenches are formed by the RIE method using another mask pattern in that portion of the third interlayer insulating film 23 in which a prescribed via hole is position and in the other portion of the third interlayer insulating film 23 and subsequently removing the exposed portion of the diffusion preventing film 22 by the RIE method. Still further, barrier metal layer 25 are formed by a sputtering method, followed by forming a wiring material layer on the third interlayer insulating film 23 including the wiring trenches and the via hole.

In the next step, the excess wiring material and the barrier metal layer 25 positioned on the third interlayer insulating film 23 except the inner region of the wiring trenches and the inner region of the via hole are removed by a CMP method so as to form a third layer wiring 24 in the third interlayer insulating film 23 such that the side surface and the bottom surface of the third layer wiring 24 are covered with the barrier metal layer 25. At the same time, a third layer wiring 24 is formed in the third interlayer insulating film 23 such that the side surface and the bottom surface of the third layer wiring 24 are covered with the barrier metal layer 25 and is electrically connected to the second layer wiring 19 through the via plug 26. Thereby, obtaining a multi-layer structure. In this CMP treatment, the excess wiring material on the third interlayer insulating film 23 is removed by a first polishing, and the excess barrier metal layer 25 positioned on the third interlayer insulating film is removed by a second polishing. Then, the entire surface is covered with a diffusion preventing layer (not shown) and with a fourth layer insulating film (not shown), followed by forming, for example, a pad, thereby manufacturing a desired semiconductor device.

The diffusion preventing film 22 and the third interlayer insulating film 23 can be formed as in the first embodiment in respect of the materials and the forming methods. Also, the barrier metal layer 25 can be formed as in the formation of the barrier metal layer 13 in respect of the material and the forming method. Further, it is possible to use, for example, copper, aluminum, tungsten or an alloy containing these metals as the wiring material. Also, the wiring material can be buried in, for example, the wiring trench by the combination of, for example, a sputtering method and a plating method.

As described above, according to the second embodiment of the present invention, formed is the second interlayer insulating film of a laminate structure in which the bottom portion of the cap insulating film 16 is buried in a large number of points in the concavities 17 of the low dielectric constant insulating film 15. As a result, it is possible to prevent the peeling at the interface between the low dielectric constant insulating film 15 and the cap insulating film 16 in the step of forming the second layer wiring 19 by the CMP treatment. It is also possible to prevent the peeling at the interface between the low dielectric constant insulating film 15 and the cap insulating film 16 in the step of forming the third layer wiring 25 by the CMP treatment applied to the third interlayer insulating film 23 positioned on the second interlayer insulating film. It follows that the dielectric constant of the second interlayer insulating film of a laminate structure consisting of the low dielectric constant insulating film 15 and the cap insulating film 16 can be lowered so as to enhance the performance and to make it possible to manufacture a semiconductor device of a high reliability, which permits preventing the peeling of the low dielectric constant insulating film 15 and the cap insulating film 16.

Third Embodiment

Figure 4:
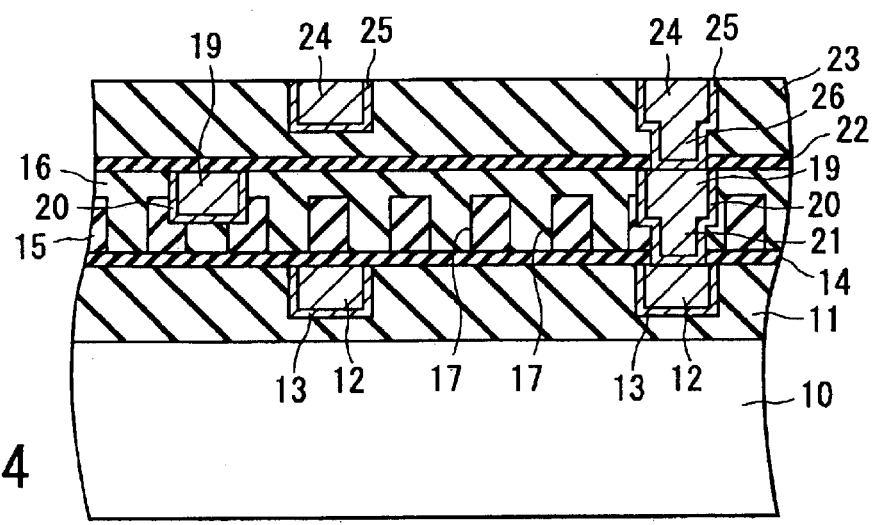
FIG. 4 is a cross-sectional view showing the construction of a semiconductor device according to a third embodiment of the present invention.

FIG. 4 is a cross sectional-view showing the construction of a semiconductor device including a multi-layered wiring structure according to a third embodiment of the present invention. Incidentally, the members of the semiconductor device shown in FIG. 4, which correspond to the members of the semiconductor device shown in FIG. 1, are denoted by the same reference numerals so as to avoid an overlapping description.

In the semiconductor device according to the third embodiment of the present invention, a large number of concavities 17 are formed in a low dielectric constant insulating film 15 constituting a first insulating film in a depth reaching a diffusion preventing film 14, and the bottom portion of a cap insulating film 16 constituting a second insulating film is buried in the low dielectric constant insulating film 15 such that the free space is not left within the concavity 17 so as to form a second interlayer insulating film, as shown in FIG. 4. For burying the bottom portion of the cap insulating film 16 in the dielectric constant insulating film 15 such that a free space is not left within the large number of concavities 17, it is advisable to employ a coating method that permits fluidizing the cap insulating material into the concavities 17 so as to fill the concavities 17.

As described above, in the third embodiment of the present invention, the cap insulating film 16 is laminated on the low dielectric constant insulating film 15 such that the bottom portion of the cap insulating film 16 is buried in the concavities 17 without leaving a free space within the concavities 17. As a result, it is possible to increase the contact area of the bottom portion of the cap insulating film 16 with the inner surface of the concavity 17, compared with the first embodiment described previously. It follows that the bonding strength between the low dielectric constant insulating film 15 and the cap insulating film 16 can be further improved because of the anchoring effect produced from the buried portion of the cap insulating film 16, compared with the first embodiment. Since the bonding strength between the low dielectric constant insulating film 15 and the cap insulating film 16 is increased, it is possible to prevent the peeling at the interface between the low dielectric constant insulating film 15 and the cap insulating film 16 during, for example, the CMP treatment for burying the second layer wiring 19 in the second interlayer insulating film of the laminate structure consisting of the low dielectric constant insulating film 15 and the cap insulating film 16. It follows that the dielectric constant of the second interlayer insulating film of a laminate structure consisting of the low dielectric constant insulating film 15 and the cap insulating film 16 can be lowered so as to enhance the performance and to make it possible to manufacture a semiconductor device of high reliability, which permits preventing the peeling of the low dielectric constant insulating film 15 and the cap insulating film 16.

It should be noted, however, that, in the third embodiment in which the bottom portion of the cap insulating film 16 is buried in the low dielectric constant insulating film 15 without leaving a free space within the concavity 17, the amount of the low dielectric constant material occupying the second interlayer insulating film is decreased so as to lower the performance achieved by the low dielectric constant material. As a result, the coupling capacitance between the adjacent wirings formed in the same insulating film and the coupling capacitance between the wiring layers formed in the different insulating films that are laminated one upon the other tends to be increased to some extent. In the third embodiment of the present invention, however, the increase in the coupling capacitance can be suppressed not to generate a practical problem, compared with the type described previously that a dummy wiring is formed in the field region of the second interlayer insulating film so as to increase the bonding strength of the interlayer insulating film having a laminated structure.

Also, it is possible for the concavities 17 in which the bottom portion of the cap insulating film 16 is buried to be formed in a part or in the entire region of the low dielectric constant insulating film 15, or in the field region of the second interlayer insulating film, in the third embodiment, too. By defining the forming region of the concavities 17, in which the bottom portion of the cap insulating film 16 is buried, to the field region of the second interlayer insulating film, it is possible to avoid an increase in the coupling capacitance between the wiring layers formed in the same insulating film and between the wiring layers formed in the different insulating films laminated one upon the other even if the concavities 17 formed on the low dielectric constant insulating film are filled completely with the bottom portion of the cap insulating film 16 such that a free space is not left at all in the concavity 17. To be more specific, the delay in the signal transmission of the wiring caused by the coupling capacitance between the wiring layers formed in the same insulating film or between the wiring layers formed in the different insulating films laminated one upon the other tends to be rendered most serious in a region having a high pattern density of the wiring. In the case of defining the concavity forming region to the field region of the second interlayer insulating film, it is possible to avoid the formation of the concavities in that portion of the low dielectric constant insulating film which corresponds to the region having a high pattern density of the wiring referred to above. It should be noted that the amount of the low dielectric constant material occupying a part of the second interlayer insulating film is substantially decreased and the substantial effect produced by the low dielectric constant is lowered in the case where the bottom portion of the cap insulating film 16 is buried in the low dielectric constant insulating film 15 such that a free space is not left within the concavity 17. However, this difficulty can be overcome in the case of defining the concavity forming region to the field region of the second interlayer insulating film. It follows that it is possible to avoid an increase in the coupling capacitance between the adjacent wiring layers formed in the same insulating film or between the adjacent wiring layers formed in the different insulating films laminated one upon the other.

Figure 5:
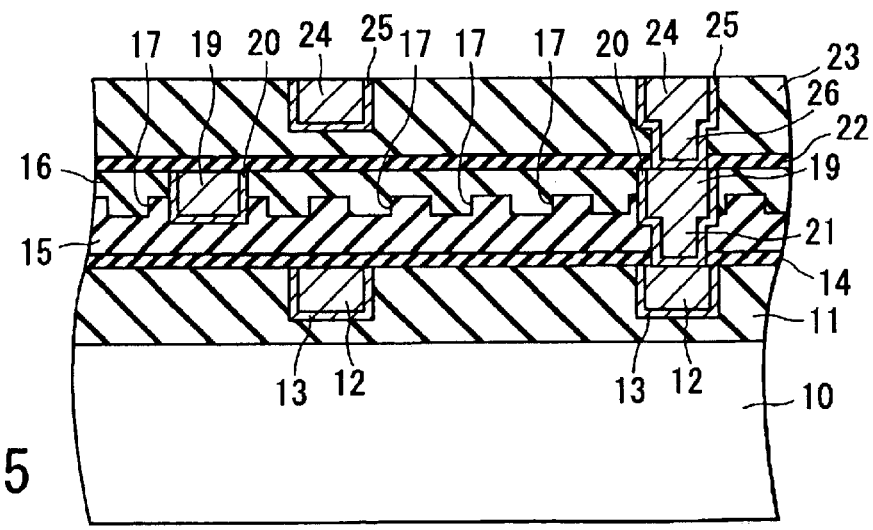
FIG. 5 is a cross-sectional view showing the construction of a semiconductor device according to another embodiment of the present invention.

Incidentally, in each of the first to third embodiments of the present invention described above, concavities extending to reach the underlying diffusion preventing film were formed in the low dielectric constant insulating film. However, as shown in FIG. 5, it is also possible to form the concavity 17 in the low dielectric constant insulating film 15 in a manner to extend downward to reach an intermediate portion in the thickness direction of the low dielectric constant insulating film 15. Even in this case, it is desirable for the depth of the concavity 17 formed in the low dielectric constant insulating film 15, in which the bottom portion of the cap insulating film 16 is buried, to be 10 nm or more.

Also, in each of the first to third embodiments described above, the insulating film in which the buried wiring is formed is of a three-layer structure. However, it is also possible to form a multi-layered wiring structure of a two-layer structure or involving four or more layers.

Further, in each of the first to third embodiments described above, the insulating film of a laminate structure consisting of the low dielectric constant insulating film and the cap insulating film is employed in the second layer. However, it is also possible to employ the particular laminate structure in the insulating film forming the first layer or the third layer. When a semiconductor device has fourth or more multi-structure, it is also possible to employ the particular laminate structure in the insulating film forming the fourth or the upper layers. Also, the application of the particular laminate structure is not necessarily limited to a single insulating film. It is also possible to apply the particular laminate structure to each of a plurality of insulating films.

An Example of the present invention will now be described with reference to FIGS. 3A to 3E.

EXAMPLE 1

In the first step, a first interlayer insulating film 11 made of $SiO_2$ and having a thickness of 300 nm was formed on the semiconductor substrate 10 by an LP-CVD method, followed by forming a wiring trench having a depth of 200 nm and a contact hole in the first interlayer insulating film 11, as shown in FIG. 3A. Then, a barrier metal layer 13 consisting of TaN/Ta was formed by a sputtering method, followed by forming a Cu layer on the barrier metal layer 14 on the first interlayer insulating film 11 including the wiring trench and the contact hole by a sputtering method and a plating method. Further, the excess conductive layer on the first interlayer insulating film 11 excluding the wiring trench and the contact hole were removed by a CMP method so as to form a first layer wiring 12 in the first interlayer insulating film 11 such that the side surface and the bottom surface of the first layer wiring 12 were covered with the barrier metal layer 13. At the same time, a contact plug (not shown) was formed in the first interlayer insulating film 11 such that the side surface and the bottom surface of the contact plug is covered with the barrier metal layer 13. In the CMP treatment, the excess Cu on the first interlayer insulating film was removed by a first polishing using CMS 7303/7304 (trade name of a CMP slurry manufactured by JSR Inc.) and, then, the excess barrier metal layer 13 on the first interlayer insulating film 11 was removed by a second polishing using CMS 8301 (trade name, manufactured by JSR Inc.). These polishing treatments were carried out under the conditions given below:

[Conditions for First Polishing]
Slurry flow rate: 250 cc/min;
Polishing pad: IC 1000 (trade name, manufactured by RODEL Inc.);
Load: 300 g/cm$^2$;
Rotating speed of each of carrier and table: 100 rpm;
Polishing time: 2 minutes;

[Conditions for Second Polishing]
Slurry flow rate: 200 cc/min;
Polishing pad: IC 1000 (trade name, manufactured by RODEL Inc.);
Load: 300 g/cm$^2$;
Rotating speed of each of carrier and table: 100 rpm;
Polishing time: 1 minute;

Then, a diffusion preventing film 14 made of SiC and having a thickness of 50 nm was formed by a CVD method on the first interlayer insulating film 11 having the first layer wiring 12 buried therein, as shown in FIG. 3B. Further, the semiconductor substrate 10 was disposed on a stage, and the diffusion preventing film 14 formed on the semiconductor substrate 10 was coated with a methyl siloxane solution while rotating the stage at a rotating speed of 2500 rpm. After the coating step, stepwise heating in which the semiconductor substrate 10 was heated at 80° C. for one minute under in an air atmosphere and, then, at 200° C. for one minute was applied to the semiconductor substrate 10 so as to evaporate the solvent contained in the solution, followed by heating the semiconductor substrate 10 at 400° C. for 30 minutes in a nitrogen gas atmosphere so as to bring about a dehydration condensation reaction. As a result, a low dielectric constant insulating film 15 consisting of polymethyl siloxane having a relative dielectric constant of 2.4 was formed. Then, a resist film (not shown) was formed on the low dielectric constant insulating film 15, followed by forming a large number of concavities 17 in the low dielectric constant insulating film 15 by an RIE method with the resist pattern used as a mask. In the RIE method, a mixed gas of $C_4F_8/CO/Ar/O_2$ system was used as the etching gas, and the etching was stopped when the diffusion preventing film 14 was exposed to the outside at the bottom of the concavity 17. Each of the concavities 17 had a rectangular opening having a short side of 0.1 μm and the concavities 17 were formed in the low dielectric constant insulating film 15 at a pitch of 0.2 μm. Also, the total area of the openings of the concavities 17 was about 25% of the surface area of the low dielectric constant insulating film 15.

In the next step, a cap insulating film 16 having a thickness of 100 nm and made of SiC having a relative dielectric constant of 2.9 was formed by a CVD method on the low dielectric constant insulating film 15 having a large number of concavities 17 formed therein, as shown in FIG. 3C. In this case, the cap insulating film 16 was laminated on the low dielectric constant insulating film 15 such that the bottom portion side of the cap insulating film 16 was buried in the concavity 17 by 10 nm in the depth direction.

In the next step, a via hole and a wiring trench having a depth of 200 nm were formed in the second interlayer insulating film having a laminate structure consisting of the low dielectric constant insulating film 15 and the cap insulating film 16, as shown in FIG. 3D. Then, a barrier metal layer 20 consisting of TaN/Ta and Cu layer were formed on the second interlayer insulating film including the via hole and the wiring trench by the method described previously. Further, the excess Cu film on the second interlayer insulating film was removed by the first polishing carried out under the conditions described previously, followed by removing the barrier metal layer 20 by the second polishing carried out under the conditions described previously. As a result, formed was a second layer wiring 19 having the side surface and the bottom surface covered with the barrier metal layer 20. Also formed was another second layer wiring 19 having the side surface and the bottom surface covered with the barrier metal layer 20 and electrically connected to the first layer wiring 12 through the via plug 21.

Further, as shown in FIG. 3E, a diffusion preventing film 22 having a thickness of 50 nm and made of SiC was formed by a CVD method on the cap insulating film 16 included in the second interlayer insulating film, followed by forming d third interlayer insulating film 23 having a thickness of 300 nm and made of LKD 27 (trade name, manufactured by JSR Inc.) by a coating method on the diffusion preventing film 22. Then, a wiring trench having a depth of 200 nm and a via hole were formed in the third interlayer insulating film 23. Subsequently, a barrier metal layer 25 consisting of TaN/Ta and Cu layer were formed on the third interlayer insulating film including the via hole and the wiring trench by the method described previously. Then, the excess Cu film on the third interlayer insulating film 23 was removed by the first polishing carried out under the conditions described previously, followed by removing the barrier metal layer 25 by the second polishing carried out under the conditions described previously. As a result, formed was a third layer wiring 24 having the side surface and the bottom surface covered with the barrier metal layer 25. Also formed was another third layer wiring 24 having the side surface and the bottom surface covered with the barrier metal layer 25 and electrically connected to the second layer wiring 19 through the via plug 26, thereby forming a multi-layered wiring structure. Then, the entire surface was covered with a diffusion preventing film (not shown) and a fourth interlayer insulating film (not shown), followed by forming pads (not shown) so as to manufacture a desired semiconductor device.

In the manufacture of the semiconductor device in Example 1, peeling did not take place at all at the interface between the low dielectric constant insulating film 15 and the cap insulating film 16 when the second layer wiring 19 was formed by a CMP method within the second interlayer insulating film of a laminate structure consisting of the low dielectric constant insulating film 15 and the cap insulating film 16. Also, the peeling at the interface between the dielectric constant insulating film 15 and the cap insulating film 16 was not recognized when the third layer wiring 24 was formed by a CMP method within the third interlayer insulating film 23.

COMPARATIVE EXAMPLE 1

A semiconductor device was manufactured as in Example 1, except that a cap insulating film was laminated on a low dielectric constant insulating film without forming concavities on the surface of the low dielectric constant insulating film. Incidentally, the interface of the lamination between the low dielectric constant insulating film and the cap insulating film was substantially flat over the entire region.

In the manufacture of the semiconductor device for Comparative Example 1, the peeling at the interface between the low dielectric constant insulating film and the cap insulating film was observed in a field region having an area not smaller than 100 µm×100 µm, in which the second layer wiring was not present, when the second layer wiring was formed by a CMP method in the second interlayer insulating film of a laminate structure consisting of the low dielectric constant insulating film and the cap insulating film.

What should be noted is that, in Example 1, it was possible to prevent the peeling at the interface between the low dielectric constant insulating film 15 and the cap insulating film 16 even in the field region in which the second layer wiring was not present over a large area in the step of forming the second layer wiring 19 by a CMP method within the second interlayer insulating film of a laminate structure consisting of the low dielectric constant insulating film 15 and the cap insulating film 16. It follows that the embodiments of the present invention makes it possible to obtain a semiconductor device having very high reliability, compared with Comparative Example 1.

Incidentally, the peeling at the interface between the low dielectric constant insulating film and the cap insulating film can also be suppressed by forming a dummy wiring in the field region of the second interlayer insulating film. However, the formation of the dummy wiring increases the coupling capacitance between the dummy wiring and the second layer wiring, the coupling capacitance between the dummy wiring and the first layer wiring, and the coupling capacitance between the dummy wiring and the third layer wiring, with the result that the delay in the signal transmission of the wiring is an issue about in the multi-layered wiring structure.

On the other hand, in Example 1 of the present invention, it is possible to suppress the generation of the peeling at the interface between the low dielectric constant insulating film and the cap insulating film while scarcely increasing the coupling capacitance between the adjacent wirings and the coupling capacitance between the adjacent wiring layers so as to make it possible to manufacture a semiconductor device of high performance and high reliability.

As described above, according to the embodiment of the present invention, it is possible to provide a semiconductor device of high performance and high reliability, which permits forming a buried wiring in an interlayer insulating film using a low dielectric constant insulating film without giving rise to the peeling problem, and a method of manufacturing the particular semiconductor device. It follows that the present invention is highly effective for realizing a multi-layered buried wiring structure mounted on, particularly, a system LSI and a high-speed logic LSI.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
   an interlayer insulating film including a first insulating film formed above a semiconductor substrate and having a relative dielectric constant smaller than 2.5 and a second insulating film formed to cover the first insulating film and having a relative dielectric constant larger than that of the first insulating film; and
   a buried wiring formed in the interlayer insulating film, wherein a bottom portion of the second insulating film is buried in a number of points in the first insulating film.

2. A semiconductor device according to claim 1, wherein the bottom portion of the second insulating film is buried in the first insulating film in a depth not smaller than 10 nm.

3. A semiconductor device according to claim 1, wherein a number of concavities are formed on that surface of the first insulating film which is positioned to face the second insulating film, and the bottom portion of the second insulating film is buried in the first insulating film in the number of concavities.

4. A semiconductor device according to claim 3, wherein the concavities are formed in the first insulating film in a regular arrangement.

5. A semiconductor device according to claim 4, wherein the concavities are formed in the first insulating film at a pitch of 0.02 to 100 µm.

6. A semiconductor device according to claim 3, wherein the bottom portion of the second insulating film is buried in the concavities with a free space left in lower portions of the concavities on the side of the semiconductor substrate.

7. A semiconductor device according to claim 3, wherein each of the concavities has a rectangular opening having a short side falling within the range of 0.01 to 0.4 µm.

8. A semiconductor device according to claim 3, wherein the concavities are selectively formed on the surface of the first insulating film which is located at a field region of the interlayer insulating film.

9. A semiconductor device according to claim 1, wherein the first insulating film is formed of at least one film selected from the group consisting of a film made of a substance having a siloxane skeleton, a film containing an organic resin as a main component, and a porous film.

10. A semiconductor device according to claim 1, wherein the second insulating film is formed of at least one compound selected from the group consisting of SiO, SiOP, SiOF, SiON, SiC, SiCH, SiCN, SiOC and SiOCH.

* * * * *